United States Patent
Gandhi et al.

(10) Patent No.: US 8,478,210 B2
(45) Date of Patent: Jul. 2, 2013

(54) APPARATUS AND METHOD OF DIGITAL PREDISTORTION FOR POWER AMPLIFIERS WITH DYNAMIC NONLINEARITIES

(75) Inventors: Hardik P. Gandhi, Sunnyvale, CA (US); Lei Ding, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 93 days.

(21) Appl. No.: 13/104,578

(22) Filed: May 10, 2011

(65) Prior Publication Data
US 2012/0286863 A1 Nov. 15, 2012

(51) Int. Cl.
*H04B 1/04* (2006.01)
(52) U.S. Cl.
USPC ......... 455/114.3; 455/67.11; 455/67.13; 455/63.1; 455/114.2; 455/126; 455/500; 455/501; 375/296; 375/254; 375/278; 375/297; 375/284; 330/148; 330/268; 330/274; 330/263; 330/271
(58) Field of Classification Search
USPC ............ 455/114.3, 67.13, 67.11, 63.1, 114.2, 455/501, 500, 126; 375/296, 297, 254, 278, 375/285, 284; 330/124 R, 148, 268, 274, 330/273, 263, 262, 265, 271
See application file for complete search history.

(56) References Cited

U.S. PATENT DOCUMENTS

| | | | |
|---|---|---|---|
| 7,366,252 B2 | 4/2008 | Cova et al. | |
| 2005/0157814 A1* | 7/2005 | Cova et al. | 375/297 |
| 2007/0164818 A1 | 7/2007 | Horiguchi et al. | |
| 2008/0111622 A1 | 5/2008 | Sperlich et al. | |

* cited by examiner

*Primary Examiner* — Junpeng Chen
(74) *Attorney, Agent, or Firm* — Alan A. R. Cooper; Wade J. Brady, III; Frederick J. Telecky, Jr.

(57) ABSTRACT

Power amplifiers (PAs) using a Doherty or other power output level sensitive configuration have been employed for several years in telecommunications (as well as other applications) to take advantage of efficiency gains. For many of these applications, baseband signals are predistorted to compensate for nonlinearities in the PAs, but because there is a "switching event" in a Doherty-type amplifier (for example), the nonlinearities become dynamically varying. As a result, digital predistortion (DPD) becomes increasingly difficult to perform. Here, DPD modules are provided that adapt to changes in dynamically varying PAs based on a determination of the average power or other relevant metric prior to transmission.

12 Claims, 3 Drawing Sheets

APPARATUS AND METHOD OF DIGITAL PREDISTORTION FOR POWER AMPLIFIERS WITH DYNAMIC NONLINEARITIES

TECHNICAL FIELD

The invention relates generally to power amplifiers and, more particularly, to digital predistortion (DPD) correction.

BACKGROUND

Turning to FIG. 1, an example of a conventional two-stage Doherty-type power amplifier (PA) 100 can be seen. PA 100 generally comprises a carrier amplifier 102, a peak amplifier 104, and a combiner 106 (which can be a node). In operation, the carrier amplifier 102 provides amplification to an input signal at low amplitude, and, as the carrier amplifier begins to saturate, the peak amplifier 104 provides additional amplification to allow for a greater overall amplitude range. A reason for having this configuration is that the efficiency for a Doherty amplifier (i.e., PA 100) is greater than a traditional amplifier (i.e., class B amplifier). An example of the difference in efficiency between PA 100 (having two and three stages), a class A amplifier, a class AB amplifier, and a class B amplifier can be seen in FIG. 2. Additionally, multiple amplifiers or amplifier sets (i.e., N-way Doherty amplifiers) can be used as PA 100.

There are some drawbacks to the Doherty configuration. For many applications, such as telecommunications, baseband signals are predistorted to compensate for nonlinearities in the power amplifiers (i.e., PA 100), but because there is a "switching event" in a Doherty-type amplifier when the peak amplifier (i.e., peak amplifier 104) becomes active, the nonlinearities become dynamically varying. As a result, DPD becomes increasingly difficult to perform. Therefore, there is a need for DPD correction of for a Doherty-type PA or other amplifiers that are sensitive to output power levels (i.e., dynamically varying PAs).

Some examples of conventional solutions are: U.S. Pat. No. 7,366,252; U.S. Patent Pre-Grant Publ. No. 2007/0164818; and U.S. Patent Pre-Grant Publ. No. 2008/0111622.

SUMMARY

An embodiment of the present invention, accordingly, provides an apparatus. The apparatus comprises baseband circuitry that receives a baseband signal, wherein the baseband circuitry includes operational mode circuitry to determine an operational mode metric for the baseband signal; and a digital predistortion (DPD) module that receives an output from the baseband circuitry and to receive the operational mode metric, wherein the DPD module selects one of a plurality of predistortions based at least in part on the operational mode metric, and wherein the DPD module applies a selected predistortion to the output from the baseband circuitry so as to predistort the output from the baseband circuitry to compensate for nonlinearities in a power amplifier having a plurality of operating modes, and wherein the selected predistotion is associated with at least one of the operating modes of the power amplifier that corresponds to the operational mode metric.

In accordance with an embodiment of the present invention, the baseband circuitry further comprises: input circuitry that receives the baseband signal; and a crest factor reduction (CFR) module that receives an output from the input circuitry that provides the output from the baseband circuitry to the DPD module.

In accordance with an embodiment of the present invention, the DPD module further comprises a controller that receives the output from the baseband circuitry, wherein the controller includes: a lookup table (LUT) that stores the plurality of predistortions; and an equalizer.

In accordance with an embodiment of the present invention, the operational mode circuitry further comprises a power meter, and wherein the operational mode metric further comprises output power, and wherein the DPD module further comprises: a plurality of comparators, wherein each comparator receives at least one of a plurality of thresholds, and wherein each comparator receives the output power, and wherein the plurality of comparators generates a selection signal; a solutions table that generates a polynomial solution based at least in part on the selection signal; and a converter that generate an LUT selection based at least in part on the polynomial solution for the controller.

In accordance with an embodiment of the present invention, the DPD module is implemented in software that is embodied on a processor and memory.

In accordance with an embodiment of the present invention, the DPD model further comprises a plurality of DPD modules, wherein each DPD module includes the LUT, the controller, and the equalizer, and wherein outputs from each DPD module are summed.

In accordance with an embodiment of the present invention, an apparatus is provided. The apparatus comprises a transmit processor having: baseband circuitry that receives a baseband signal, wherein the baseband circuitry includes operational mode circuitry to determine an operational mode metric for the baseband signal; a DPD module that receives an output from the baseband circuitry and to receive the operational mode metric, wherein the DPD module selects one of a plurality of predistortions based at least in part on the operational mode metric, and wherein the DPD module applies a selected predistortion to the output from the baseband circuitry so as to predistort the output from the baseband circuitry to compensate for nonlinearities in a power amplifier having a plurality of operating modes, and wherein the selected predistotion is associated with at least one of the operating modes of the power amplifier that corresponds to the operational mode metric; a transmit interface that receives an output from the DPD module; and a feedback interface that provides feedback to the DPD module; a transmit circuit that is coupled to the transmit interface; and a feedback circuit that is coupled to the feedback interface.

In accordance with an embodiment of the present invention, wherein the power amplifier further comprises a Doherty amplifier, and wherein the transmit circuit further comprises: a digital-to-analog converter (DAC) that is coupled to the transmit interface; a modulator that is coupled to the DAC; and the Doherty amplifier that is coupled to the modulalor.

In accordance with an embodiment of the present invention, the feedback interface further comprises: a demodulator that is coupled to the Doherty amplifier; and an analog-to-digital converter (ADC) that is coupled between the demodulator and feedback interface.

In accordance with an embodiment of the present invention, a method is provided. The method comprises determining a output power for a baseband signal; selecting at least one of a plurality of predistortions based at least in part on the output power, wherein the selected predistotion is associated with at least one of a plurality of operating modes of a power amplifier corresponding to the output power; predistorting the baseband signal with the selected predistortion so as to compensate for nonlinearities in the power amplifier at the output power and to generate a predistorted signal; converting the predistorted signal into an analog signal; modulating the analog signal to generate a radio frequency (RF) signal; and amplifying the RF signal with the power amplifier.

In accordance with an embodiment of the present invention, the step of selecting further comprises: comparing the output power to a plurality of thresholds to generate a selection signal; generating a polynomial solution from the selection signal; converting the polynomial solution to an LUT selection; and generating the selected predistortion based on the LUT selection and the baseband signal.

In accordance with an embodiment of the present invention, the step of selecting and predistorting further comprises: receiving the baseband signal by a plurality of DPD modules; and combining outputs from each of the DPD modules based on the output power to generate the predistorted signal.

In accordance with an embodiment of the present invention, the method further comprises processing the baseband signal with a CFR process prior to the step of selecting.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
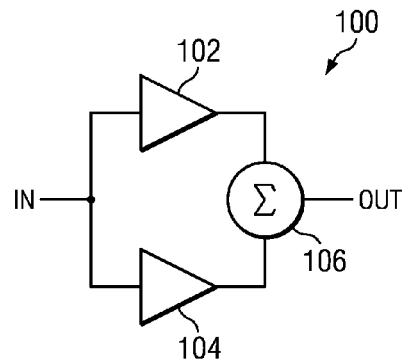
FIG. 1 is a diagram of an example of a conventional Doherty PA.

Refer now to the drawings wherein depicted elements are, for the sake of clarity, not necessarily shown to scale and wherein like or similar elements are designated by the same reference numeral through the several views.

Figure 3:
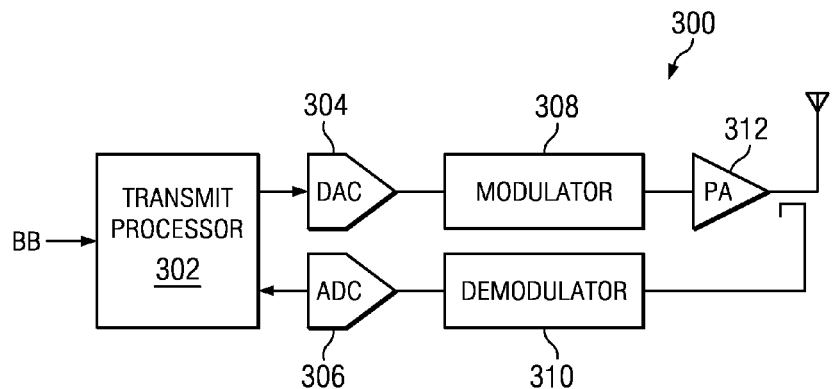
FIG. 3 is a diagram of an example of a transmitter in accordance with an embodiment of the present invention.

Turning to FIG. 3, a transmitter 300 in accordance with an embodiment of the invention can be seen. In operation, the transmitter 300 is able to convert the baseband signal BB to radio frequency (RF) so as to be transmitted over the transmit circuitry. As part of the conversion process, the transmit processor 302 can perform crest factor reduction (CFR), digital upconversion, DPD, and other processes on the baseband signal BB in the digital domain so as to generate digital in-phase (I) and quadrature (Q) signals. These digital I and Q signals are then converted to analog I and Q signals by digital-to-analog converter (DAC) 304 so as to generate analog signals for the modulator (i.e., mixers and a phase adjuster). The modulator then generate the RF signal for PA 312 (which may be a Doherty-type amplifier as shown in FIG. 1 or another output power level sensitive amplifier). This PA 312, however, is nonlinear, so the transmit processor's 302 DPD correction allows for the signal to be predistorted in baseband to compensate for nonlinearities in the PA 312.

To perform this DPD correction, transmit processor 302 employs a feedback system, namely feedback circuitry. The feedback circuitry generally comprises analog-to-digital converter (ADC) 306 and a demodulator 310 (which includes mixers and a phase adjuster). Typically, the demodulator 310 is able to demodulate the RF output from the PA 312 to generate analog I and Q feedback signals, which are then converted to digital I and Q signals by ADC 306.

Figure 4:
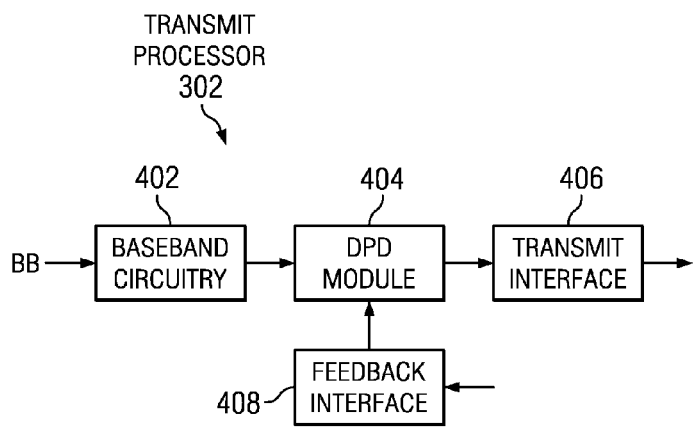
FIG. 4 is a diagram of an example of the transmit processor of FIG. 3.
Figure 2:
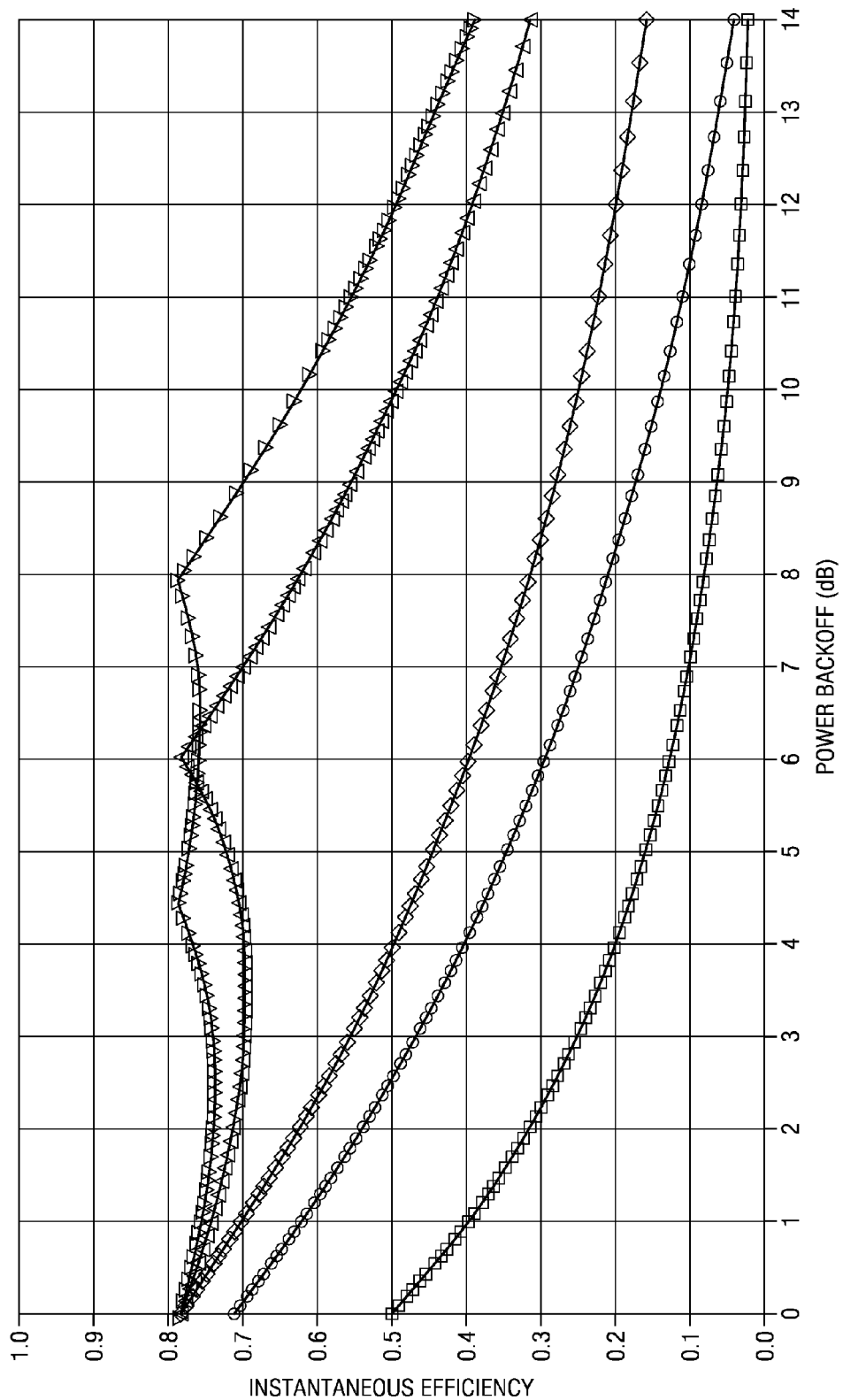
FIG. 2 is a diagram illustrating the efficiency of the PA of FIG. 1.
Figure 6:
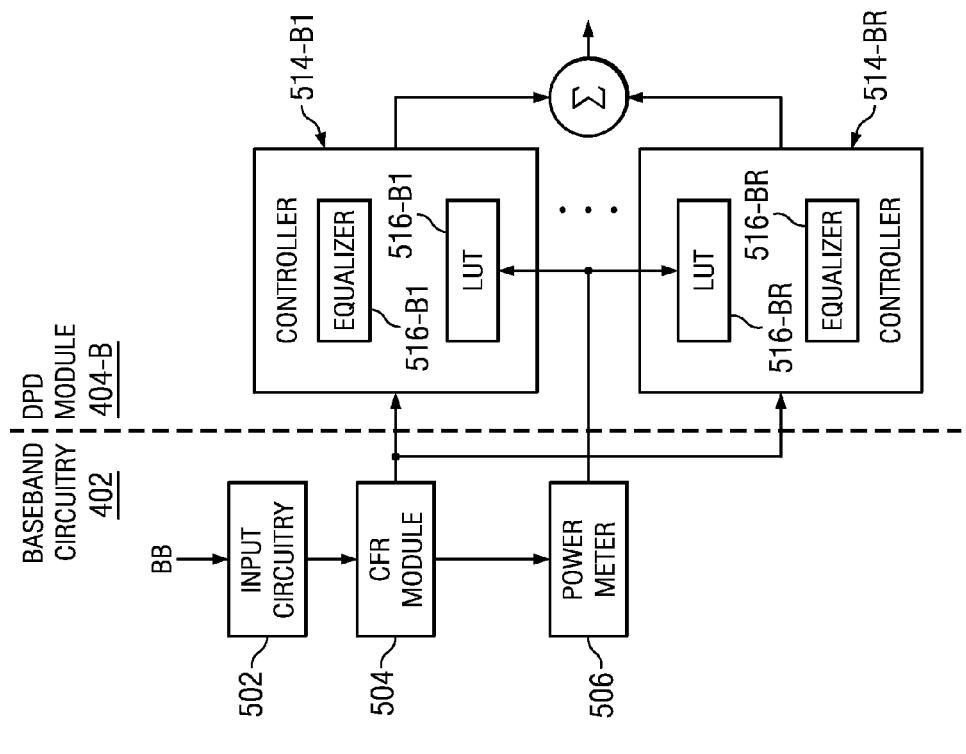
FIGS. 5 and 6 are diagrams of examples of the baseband circuitry and DPD module of FIG. 4.
Figure 5:
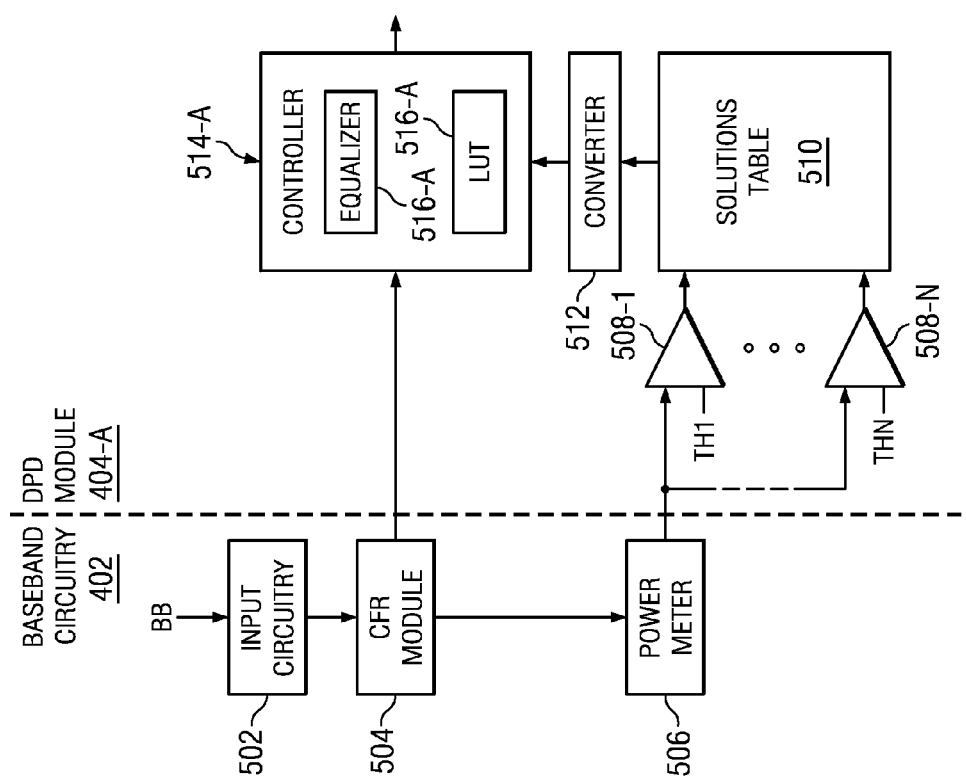

Turning to FIG. 4, an examples of the transmit processor 302 can be seen in greater detail. As shown, the transmit processor 302 generally includes baseband circuitry 402 (which can perform CFR and as well as other tasks), a DPD module 404 (which can either be hardware, software embodied on a processor and memory and which performs the DPD correction, or some combination thereof), transmit interface 406 (which provides the digital I and Q transmit signals to the transmit circuitry), and feedback interface 408 (which receives digital I and Q feedback signals from the feedback circuitry). In operation, baseband circuitry 402 receives a baseband signal BB and processes the baseband signal BB by performing CFR and as well as other tasks. This output is then predistorted by the DPD module 404 and provided to the transmit interface 406. The feedback interface 408 can then provide feedback to the DPD module 404 so as to update its DPD model. One issue with conventional transmit processors (namely, in its DPD processing) is that these transmit processors are ill-equipped to compensate for dynamically varying PAs (i.e., PA 312). In FIGS. 5 and 6, examples of DPD modules 404-A and 404-B (which are better equipped to compensate for such PAs) can be seen.

Looking first to DPD module 404-A of FIG. 5, it offers compensation for each nonlinear operating point by storing and adapting on multiple DPD solutions. In operation, the power meter 506 determines the running average power that would be provided by PA 312 from the baseband signal BB (as modified by the CFR module 504); this computation is performed in the digital domain. Alternatively, the power meter 506 can be replaced with other operational mode circuitry that can determine operational mode or performance of the PA 312 such as a frequency content analyzer that can determine the operational mode of the PA 312 based on the baseband signal BB or a temperature sensor that can determine the operational mode of the PA 312 based on its temperature. This average power (or other operational mode metric) can then be provided to comparators 508-1 to 508-N so as to be compared to thresholds TH1 to THN, respectively, and to generate a selection signal (having N-bits). This selection signal is representative of the mode of the PA 312 (i.e., carrier mode where the carrier amplifier 102 is operating and peak mode where the carrier amplifier 104 and peak amplifier 104 are operating). Based on this selection signal, a polynomial solution (and, in some cases, LUT contents that can be loaded directly into the controller 512) can be selected from the selection table 510 (which can, for example, have 16 solutions). The selected polynomial solution can then be converted to lookup table (LUT) selection by converter 512. So, as the baseband signal BB (as modified by the CFR module 504) is provided the controller 514-A, the controller 514-A chooses a DPD correction from the LUT 516-A (which is generally comprised of several LUTs) based feedback from the feedback interface 408 and the LUT selection, and the controller 514-A applies this DPD correction to the baseband signal BB (as modified by the CFR module 504) to generate a predistorted signal. This predistorted signals is then equalized by equalizer 516-A and provided to the transmit interface 406.

Turning to DPD module 404-B of FIG. 6, it offers a gradual transition between nonlinear solutions. Similar to baseband circuitry 402 of FIG. 5, the power meter 506 (or other alternative operational mode circuitry) can determine the running average power that would be provided by PA 312 from the baseband signal BB (as modified by the CFR module 504) or other metric related to the mode of the PA 312. This average power (or other metric) can then be provided to separate DPD datapaths (here, as an example, there are R datapaths). In particular, this average power or other metric can be provided to the controller 514-B1 to 514-BR for each datapath, and, based on this average power or other metric, the appropriate datapath(s) (which generally correspond to the mode of PA 312) can be "activated." Additionally, power or other similar information (i.e., from the power meter 506) may be used to adjust LUT contents and equalizer coefficients. The "activated" datapaths can then apply their DPD corrections (i.e., from LUTs 516-B1 to 516BR) and equalize their predistorted signals (i.e., by equalizers 516-B1 to 516-BR). These predistorted signals are then summed and provided to the transmit interface 406, allowing for the gradual transition between nonlinear solutions.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
baseband circuitry that receives a baseband signal, wherein the baseband circuitry includes a operational mode circuitry to determine an operation mode metric for the baseband signal; and
a digital predistortion (DPD) module that receives an output from the baseband circuitry and to receive the operational mode metric,
wherein the DPD module selects one of a plurality of predistortions based at least in part on the operational mode metric, and
wherein the DPD module applies a selected predistortion to the output from the baseband circuitry so as to predistort the output from the baseband circuitry to compensate for nonlinearities in a power amplifier having a plurality of operating modes, and
wherein the selected predistotion is associated with at least one of the operating modes of the power amplifier that corresponds to the operational mode metric,
wherein the baseband circuitry further comprises:
input circuitry that receives the baseband signal; and
a crest factor reduction (CFR) module that receives an output from the input circuitry that provides the output from the baseband circuitry to the DPD module,
wherein the DPD module further comprises a controller that receives the output from the baseband circuitry, wherein the controller includes:
a lookup table (LUT) that stores the plurality of predistortions; and
an equalizer,
wherein the operational mode circuitry further comprises a power meter, and wherein the operational mode metric further comprises output power, and wherein the DPD module further comprises:
a plurality of comparators, wherein each comparator of the plurality of comparators receives at least one of a plurality of thresholds, and wherein each comparator receives the output power, and wherein each comparator generates a bit of a selection signal T1-$n$;
a solutions table that generates a polynomial solution based at least in part on the T1-$n$ selection signal; and
a converter that generate an LUT selection based at least in part on the polynomial solution for the controller.

2. The apparatus of claim 1, wherein the DPD module is implemented in software that is embodied on a processor and memory.

3. The apparatus of claim 1, wherein the DPD model further comprises a plurality of DPD modules, wherein each DPD module includes the LUT, the controller, and the equalizer, and wherein outputs from each DPD module are summed.

4. The apparatus of claim 3, wherein the DPD module is implemented in software that is embodied on a processor and memory.

5. An apparatus comprising:
a transmit processor having:
baseband circuitry that receives a baseband signal, wherein the baseband circuitry includes a operational mode circuitry to determine an operational mode metric for the baseband signal;
a DPD module that receives an output from the baseband circuitry and to receive the operational mode metric, wherein the DPD module selects one of a plurality of predistortions based at least in part on the operational mode metric, and wherein the DPD module applies a selected predistortion to the output from the baseband circuitry so as to predistort the output from the baseband circuitry to compensate for nonlinearities in a power amplifier having a plurality of operating modes, and wherein the selected predistotion is associated with at least one of the operating modes of the power amplifier that corresponds to the operational mode metric;
a transmit interface that receives an output from the DPD module; and
a feedback interface that provides feedback to the DPD module;
a transmit circuit that is coupled to the transmit interface; and
a feedback circuit that is coupled to the feedback interface,
wherein the baseband circuitry further comprises:
input circuitry that receives the baseband signal; and
a CFR module that receives an output from the input circuitry that provides the output from the baseband circuitry to the DPD module,
wherein the DPD module further comprises a controller that receives the output from the baseband circuitry, wherein the controller includes:
an LUT that stores the plurality of predistortions; and
an equalizer, wherein the operational mode circuitry further comprises a power meter, and wherein the operational mode metric further comprises output power, and
wherein the DPD module further comprises:
- a plurality of comparators, wherein each comparator of the plurality of comparators receives at least one of a plurality of thresholds, and wherein each comparator receives the output power, and wherein each comparator generates a bit of a selection signal T1-$n$;
- a solutions table that generates a polynomial solution based at least in part on the T1-$n$ selection signal; and
- a converter that generate an LUT selection based at least in part on the polynomial solution for the controller.

6. The apparatus of claim 5, wherein the power amplifier further comprises a Doherty amplifier, and wherein the transmit circuit further comprises:
- a digital-to-analog converter (DAC) that is coupled to the transmit interface;
- a modulator that is coupled to the DAC; and
- the Doherty amplifier that is coupled to the modulator.

7. The apparatus of claim 6, wherein the feedback interface further comprises:
- a demodulator that is coupled to the Doherty amplifier; and
- an analog-to-digital converter (ADC) that is coupled between the demodulator and feedback interface.

8. The apparatus of claim 5, wherein the DPD model further comprises a plurality of DPD modules, wherein each DPD module includes the LUT, the controller, and the equalizer, and wherein outputs from each DPD module are summed.

9. The apparatus of claim 8, wherein the DPD module is implemented in software that is embodied on a processor and memory.

10. The apparatus of claim 8, wherein the DPD module is implemented in software that is embodied on a processor and memory.

11. A method comprising:
- determining a output power for a baseband signal;
- selecting at least one of a plurality of predistortions based at least in part on the output power, wherein the selected predistotion is associated with at least one of a plurality of operating modes of a power amplifier corresponding to the output power;
- predistorting the baseband signal with the selected predistortion so as to compensate for nonlinearities in the power amplifier at the output power and to generate a predistorted signal;
- converting the predistorted signal into an analog signal;
- modulating the analog signal to generate a radio frequency (RF) signal; and
- amplifying the RF signal with the power amplifier,
wherein the step of selecting and predistorting further comprises:
- receiving the baseband signal by a plurality of DPD modules;
  - combining outputs from each of the DPD modules based on the output power to generate the predistorted signal,
- processing the baseband signal with a CFR process prior to the step of selecting, wherein the DPD module further comprises:
  - a plurality of comparators, wherein each comparator of the plurality of comparators receives at least one of a plurality of thresholds, and wherein each comparator receives the output power, and wherein each comparator generates a bit of a selection signal T1-$n$;
  - a solutions table that generates a polynomial solution based at least in part on the T1-$n$ selection signal; and
  - a converter that generate an LUT selection based at least in part on the polynomial solution for the controller.

12. The method of claim 11, wherein the step of selecting further comprises:
- comparing the output power to a plurality of thresholds to generate a selection signal;
- generating a polynomial solution from the selection signal;
- converting the polynomial solution to an LUT selection; and
- generating the selected predistortion based on the LUT selection and the baseband signal.

* * * * *